(12) United States Patent
Leray et al.

(10) Patent No.: US 9,595,423 B2
(45) Date of Patent: *Mar. 14, 2017

(54) FREQUENCY TUNING FOR DUAL LEVEL RADIO FREQUENCY (RF) PULSING

(71) Applicant: APPLIED MATERIALS, INC., Santa Clara, CA (US)

(72) Inventors: Gary Leray, Mountain View, CA (US); Valentin Nikolov Todorow, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/068,999

(22) Filed: Mar. 14, 2016

(65) Prior Publication Data
US 2016/0196958 A1 Jul. 7, 2016

Related U.S. Application Data

(63) Continuation of application No. 14/537,037, filed on Nov. 10, 2014, now Pat. No. 9,318,304.

(60) Provisional application No. 61/902,396, filed on Nov. 11, 2013.

(51) Int. Cl.
*H01J 7/24* (2006.01)
*H01J 37/32* (2006.01)

(52) U.S. Cl.
CPC .. *H01J 37/32165* (2013.01); *H01J 37/32082* (2013.01); *H01J 37/32146* (2013.01); *H01J 37/32155* (2013.01); *H01J 37/32183* (2013.01)

(58) Field of Classification Search
CPC ......... H01J 37/32082; H01J 37/32146; H01J 37/32165; H01J 37/32183
USPC ................. 315/111.21, 344; 204/157.15; 156/345.48; 216/67
See application file for complete search history.

(56) References Cited

U.S. PATENT DOCUMENTS

| | | | |
|---|---|---|---|
| 4,837,185 A | 6/1989 | Yau et al. | |
| 8,264,154 B2 | 9/2012 | Banner et al. | |
| 8,808,561 B2 | 8/2014 | Kanarik | |
| 8,883,028 B2 | 11/2014 | Kanarik | |
| 8,952,765 B2 * | 2/2015 | Fisk, II | H01J 37/32174 315/111.31 |
| 9,030,101 B2 | 5/2015 | Valcore, Jr. et al. | |
| 9,114,666 B2 | 8/2015 | Valcore, Jr. et al. | |
| 9,171,699 B2 | 10/2015 | Valcore, Jr. et al. | |

(Continued)

*Primary Examiner* — Thuy Vinh Tran
(74) *Attorney, Agent, or Firm* — Moser Taboada; Alan Taboada

(57) ABSTRACT

Methods and apparatus for frequency tuning in process chambers using dual level pulsed power are provided herein. In some embodiments, a method for frequency tuning may include providing a first pulsed power at a first frequency while the first frequency is adjusted to a second frequency, wherein the first frequency is a last known tuned frequency at the first pulsed power, storing the second frequency as the last known tuned frequency at the first pulsed power, providing a second pulsed power at a third frequency while the third frequency is adjusted to a fourth frequency, wherein the first pulsed power and the second pulsed power are different and non-zero, and wherein the third frequency is a last known tuned frequency at the second pulsed power, and storing the fourth frequency as the last known tuned frequency at the second pulsed power.

17 Claims, 3 Drawing Sheets

(56) References Cited

U.S. PATENT DOCUMENTS

| | | |
|---|---|---|
| 9,197,196 B2 | 11/2015 | Valcore, Jr. et al. |
| 9,214,320 B2 | 12/2015 | Kanarik |
| 9,275,870 B2 * | 3/2016 | Xu .................... H01J 37/32091 |
| 2009/0139963 A1 * | 6/2009 | Panagopoulos ....... H01J 37/321 |
| | | 216/68 |
| 2014/0009073 A1 * | 1/2014 | Valcore, Jr. .............. H05H 1/46 |
| | | 315/183 |
| 2014/0265852 A1 | 9/2014 | Valcore, Jr. et al. |
| 2015/0020971 A1 | 1/2015 | Kanarik |
| 2015/0206717 A1 | 7/2015 | Valcore, Jr. et al. |

* cited by examiner

FREQUENCY TUNING FOR DUAL LEVEL RADIO FREQUENCY (RF) PULSING

CROSS-REFERENCE TO RELATED APPLICATIONS

This application is a continuation of U.S. patent application Ser. No. 14/537,037, filed Nov. 10, 2014, and issued as U.S. Pat. No. 9,318,304 on Apr. 19, 2016, which also claims the benefit of U.S. provisional patent application Ser. No. 61/902,396, filed Nov. 11, 2013, which is herein incorporated by reference in its entirety.

FIELD

Embodiments of the present disclosure generally relate to semiconductor processing and, more specifically, to methods and apparatus for frequency tuning in process chambers using a pulsed plasma.

BACKGROUND

In semiconductor integrated circuit (IC) fabrication, devices such as component transistors are formed on a semiconductor substrate. During the fabrication process, various materials are deposited or etched on different layers in order to build or form the desired integrated circuit. The various layers define devices that are interconnected by metallization lines. During certain plasma enhanced processes performed upon substrates that already contain devices and metalized lines, a substantial amount of charge may accumulate on the surface of the substrate. This charge accumulation may not be uniform across the substrate may cause destructive currents to be induced the metalized materials and/or cause arcing within or across dielectric layers. The currents and/or arcing may destroy or damage devices that have previously been formed on the substrate. To mitigate the charging effects and avoid charging damage, the power supplied to a plasma within a plasma enhanced reactor may be pulsed during all or part of the plasma process.

When pulsing the plasma, the power from a radio frequency (RF) power source may be coupled through a dynamically tuned matching network (also referred to as a match unit) to an antenna or electrode within the reactor. The pulsed power is coupled from the antenna or electrode to process gases within the reactor to form a plasma that is used for the etching process. The matching network ensures that the output of the RF source is efficiently coupled to the plasma to maximize the amount of energy coupled to the plasma (e.g., referred to as tuning the RF power delivery). Thus, the matching network ensures that the total impedance (i.e., plasma impedance+chamber impedance+matching network impedance) is the same as the output impedance of the RF power delivery.

In continuous wave and single level pulsing (e.g., pulsing between an on state and an off state), there is only one state to tune to (e.g., the on state). However, in dual level pulsing, the RF power source is switched between a high state and a low state (e.g., not an off state), at a pulse frequency and a pulse duty cycle. Thus, the RF power delivered alternates between two different on states that have to be tuned to. However, due to the high frequency at which the different on states are provided during dual level pulsing processes, tuning with variable capacitors is not possible due to the low speed of variable capacitor movements.

In view of the foregoing, the inventors have provided embodiments of improved methods and apparatus for frequency tuning in process chambers using dual level pulsed RF power.

SUMMARY

Methods and apparatus for frequency tuning in process chambers using dual level pulsed power are provided herein. In some embodiments, a method for frequency tuning may include providing a first pulsed power at a first frequency by an RF power source for a first period of time while the first frequency is adjusted to a second frequency to achieve a desired impedance at the first pulsed power between the RF power source and a load, wherein the first frequency is a last known tuned frequency at the first pulsed power, storing the second frequency as the last known tuned frequency at the first pulsed power, providing a second pulsed power at a third frequency by the RF power source for a second period of time while the third frequency is adjusted to a fourth frequency to achieve a desired impedance at the second pulsed power between the RF power source and the load, wherein the first pulsed power and the second pulsed power are different and non-zero, and wherein the third frequency is a last known tuned frequency at the second pulsed power, and storing the fourth frequency as the last known tuned frequency at the second pulsed power.

In some embodiments, a method for frequency tuning in process chambers using dual level pulsed power may include alternately providing RF energy to a plasma in a process chamber at a first power level and a second power level, wherein the first and second power levels are different and non-zero, wherein the RF energy provided at the first power level has a first frequency and is provided for a first period of time, wherein the RF energy provided at the second power level has a second frequency and is provided for a second period of time, tuning the first frequency of the RF energy during the first period of time and the second frequency of the RF energy during the second period of time to reduce a reflected power of the RF energy and storing a last known tuned value of the first frequency and the second frequency, and when switching between power levels, setting an initial frequency of the RF energy to the last known tuned value of the first frequency or the second frequency.

In some embodiments, a method for frequency tuning in process chambers using dual level pulsed power may include providing RF energy having a first frequency and a first power level for a first period of time to a plasma formed in a process chamber, wherein the first power level is non-zero, during the first period, tuning the first frequency to a first tuned frequency to minimize RF power reflected from the plasma, subsequently providing RF energy having a second frequency and a second power level for a second period to the plasma, wherein the second power level is non-zero and different than that first power level, during the second period, tuning the second frequency to minimize RF power reflected from the plasma, and subsequently providing RF energy having the first tuned frequency and the first power level for a third period to the plasma.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are not to be considered limiting of its scope, for the disclosure may admit to other equally effective embodiments.

Figure 1:
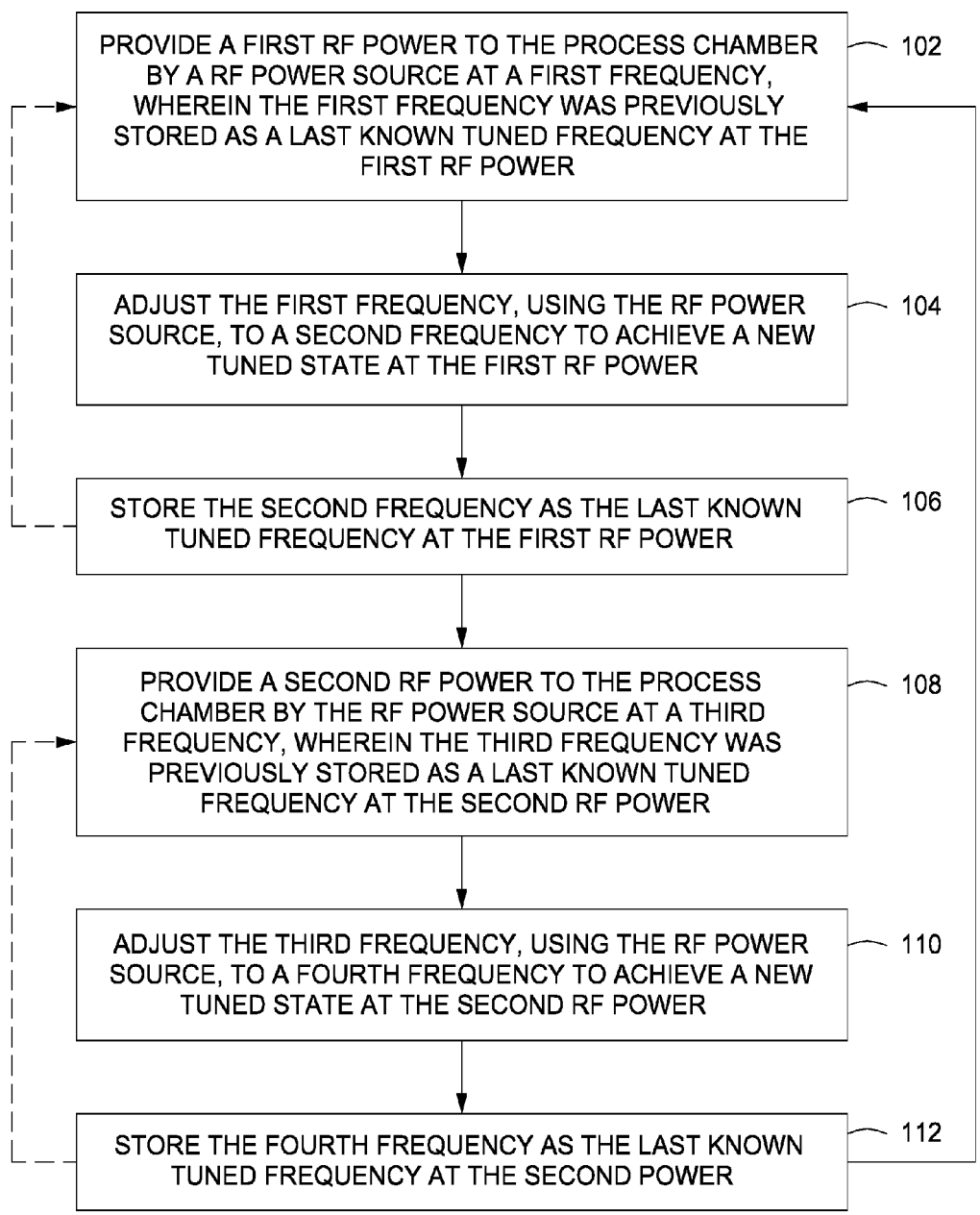
FIG. 1 depicts a method for frequency tuning in process chambers using dual level pulsed power in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure provide methods and apparatus for operating a plasma enhanced substrate processing system using dual level pulsed radio frequency (RF) power. More specifically, embodiments of the present disclosure allow for frequency tuning in process chambers using dual level pulsed power, which yields a dual plasma condition (e.g., two different plasma on states) which is useful for plasma processing of substrates, for example, in thin-film processing and microelectronic device fabrication. In some embodiments, the inventive methods may advantageously provide methods for fast frequency tuning between two plasma on states. As used herein, tuning refers to the process of varying (e.g., tuning) the impedance of the electrical pathway seen by the RF source (i.e., plasma impedance+chamber impedance+matching network impedance) in order to minimize power reflected back to the RF power source from the plasma and maximize efficient coupling of power from the RF power source to the plasma.

The inventors have observed that conventional tuning using a variable capacitor in a matching network for dual level pulsing is too slow due to the slow speed of movement of the variable capacitor in the matching network. In addition, although frequency tuning for dual level pulsing may be sufficiently fast, the inventors have observed that conventional methodologies of letting the RF power source tune with frequency tuning at every state change (from a high state to a low state, or from a low state to a high state) is not sufficient to have good and reliable tuning.

Accordingly, the inventors have provided methods to achieve improved tuning in dual level pulsing processes. FIG. 1 depicts a method 100 for frequency tuning in process chambers using dual level pulsed power processes in accordance with some embodiments of the present disclosure. The inventive methods may be utilized in conjunction with any type of process chamber utilizing RF power having a variable frequency and dual level pulsing provided by an RF power source, for example, such as the process chamber 310 and RF power source 318 described below with respect to FIG. 3. The method 100 is described in conjunction with the power and frequency timing diagrams of FIG. 2.

Figure 2:
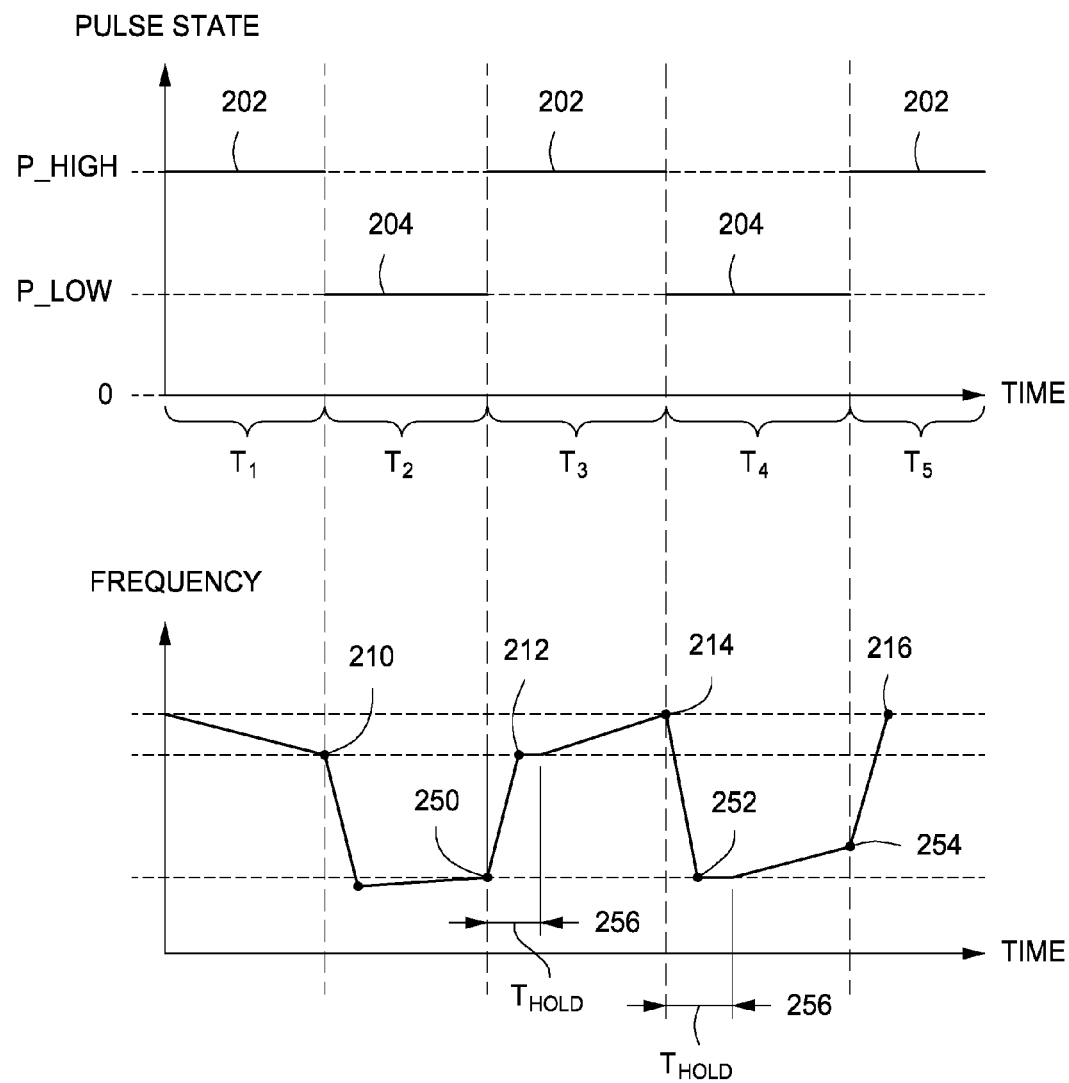
FIG. 2 depicts a graph showing power level and frequency over time for the inventive method for dual frequency tuning in dual level pulsing in a process chamber in accordance with some embodiments of the present disclosure.

During processing, the RF power source 318 provides two different, non-zero pulsed power levels, a high power level state (p_high) and a low power level state (p_low). During dual level pulsing, the RF power source 318 will alternate providing power at the two distinct power levels, p_high and p_low, at discrete time intervals, as shown in FIG. 2, for example, p_high 202 at t1, p_low 204 at t2, p_high 202 at t3, p_low 204 at t4, etc. The length of each time period that p_low and p_high are applied may be about 10 microseconds to about 1 second. The time periods for p_low and p_high are typically the same length, however, in some embodiments, the p_low may be applied for a different length of time than p_high. In some embodiments, the RF power source 318, or a controller associated with RF power source 318, tracks two tuning conditions with two frequencies (f_high and f_low). In effect, the frequency tuner of the RF power source 318 is provided with the power level state of the RF power source 318, so that the RF power source 318 can move to the frequency corresponding to the state (f_high for high state p_high, or f_low for low state p_low). It should be understood to those skilled in the art that the designation of f_high and f_low pertains to the frequency associated with the p_high state and p_low state, respectively, and does not imply that the frequency at f_high is greater than the frequency of f_low. For example, in some embodiments, the magnitude of the frequency at f_high may be greater than f_low, less than f_low, or equal to f_low.

In some embodiments, the pulse frequency may be about 1 Hz to about 50 kHz. The pulse frequency for dual level pulsing is defined as the number of times a pulsed activity (p_high+p_low) occurs every second. The duty cycle for each state in a dual level pulsing system is the percent of time that the RF power supply provides power at the particular state as a fraction of the total time under consideration. That is, the duty cycle for p_high is the time p_high is applied (p_high ON-time) divided by the total time that one cycle of p_high and p_low are applied (p_high ON-time+p_low ON-time). In some embodiments, p_high ON-time may be less than, greater than, or equal to p_low ON-time. As such, in embodiments consistent with the present disclosure, the duty cycle for each state may be from about 1% to about 99%. A 50% duty cycle would indicate that each state applied for the same amount of time.

In some embodiments, the power levels of the high pulsed power state may be about 5 watts to about 20 kilowatts. Similarly, the power levels of the low pulsed power state may also be about 5 watts to about 20 kilowatts, although p_low will be lower than p_high for a given process. Although described herein as a dual level pulsing between two RF power states, in the embodiments described herein, the levels of RF power provided may be more than two different power states (i.e., a multi-level pulsed power provided to the process chamber). For an N-level pulsed power, a pulse frequency and (N−1) duty cycles, or N ON-times would be used.

The method 100 generally begins at 102 where a first pulsed RF power is provided to the process chamber by an RF power source, such as RF power source 318. The first RF power is one of two different power states (p_high or p_low) of a dual level pulsed power provided to the process chamber. A first frequency may be associated with the first pulsed RF power. In some embodiments, the first frequency may have been stored as the last known tuned frequency at the first RF power. That is, in order to provide fast frequency tuning, a frequency tuner, such as for example frequency tuner 360 in FIG. 3 in the RF power source 318, is provided with the frequency that achieved a desired impedance at the first pulsed RF power between the RF power source and a load (e.g., the plasma). For example, as shown in FIG. 2, if the first RF pulsed power is a high power state, (e.g., p_high 202 at t3), the frequency at which the system 300 was tuned the last time it was at p_high (i.e., frequency 210) will be used as the first frequency (i.e., frequency 212) at which RF power p_high is provided at t3. During initial operation, a last known tuned frequency may not exist. Accordingly, an estimated or default value may be used as the initial frequency for the first time period. The default initial frequency set may depend in the chamber design.

At 104, the first frequency is adjusted to a second frequency to achieve a new tuned state at the first pulsed RF power level (i.e., achieve a desired impedance at the first pulsed RF power between the RF power source and a load). Specifically, although the first frequency is provided at the last known tuned frequency, the system 300 may perform additional tuning to achieve the desired impedance match between the RF power source and a load. In some embodiments, the first frequency may be adjusted to the second frequency to reduce a reflected power from the RF power source to achieve a new tuned state of the system 300. The reflected power is typically reduced to a target of about 0% of a forward power provided by the RF power source to achieve a tuned state. In some embodiments, an allowable band of reflected power may be considered a tuned state depending on the chamber design. In some embodiments, the frequency may be adjusted to the new tuned state using the frequency tuner 360 of the RF power source 318 at the first pulsed RF power. For example, with respect to FIG. 2, the first frequency 212 may be adjusted by frequency tuner 360 to achieve a new tuned state at second frequency 214 at the high power state p_high 202.

Once the system 300 is tuned at 104 at the second frequency (e.g., frequency 214 in FIG. 2), the second frequency is stored as the last known tuned frequency to be used the next time the RF power source provide power at the first pulsed RF power state (e.g., p_high 216 at t5) at 106. As used herein, storing the frequency includes storing information associated with the frequency, such as for example, storing a magnitude of the frequency in association with the corresponding power level. The last known tuned frequency at the first power level may be stored by the RF power source, such as for example, in the memory 364 of controller 362 of RF power source 318. In some embodiments, the last known tuned frequency at the first power level may be stored by a controller associated with RF power source 318, such as for example, in memory 342 of controller 340 and provided to the RF power source.

At 108, a second RF power is provided to the process chamber by the RF power source at a third frequency, wherein the third frequency is a last known tuned frequency at the second RF power. For example, as shown in FIG. 2, a second RF power, p_low 204, which is different from the first RF power, p_high, is applied at time t4 at a third frequency 252. For example, as shown in FIG. 2, if the second RF pulsed power is a low power state, (e.g., p_low 204 at t4), the frequency at which the system 300 was tuned the last time it was at p_low (i.e., frequency 250) will be used as the third frequency (i.e., frequency 252) at which RF power p_low 204 is provided at t4.

At 110, the third frequency is adjusted to a fourth frequency to achieve a new tuned state at the second pulsed RF power level (i.e., achieve a desired impedance at the second pulsed RF power between the RF power source and a load). In some embodiments, the third frequency may be adjusted to the fourth frequency to reduce a reflected power from the RF power source to achieve the new tuned state at the second RF power level of the system 300. The reflected power is typically reduced to a target of about 0% of a forward power provided by the RF power source to achieve a tuned state. In some embodiments, an allowable band of reflected power may be considered a tuned state depending on the chamber design. The frequency may be adjusted to the new tuned state using the frequency tuner 360 of the RF power source 318 at the second pulsed RF power. For example, with respect to FIG. 2, the third frequency 252 may be adjusted by frequency tuner 360 to achieve a new tuned state at fourth frequency 254 at the high power state p_low 204.

Once the system 300 is tuned at 110 at the fourth frequency (e.g., frequency 254 in FIG. 2), the fourth frequency is stored as the last known tuned frequency to be used the next time the RF power source provides power at the second pulsed RF power state (e.g., p_low 204) at 112. As used herein, storing the frequency includes storing information associated with the frequency, such as for example, storing a magnitude of the frequency in association with the corresponding power level. The last known tuned frequency at the second power level may be stored by the RF power source, such as for example, in the memory 364 of controller 362 of RF power source 318. In some embodiments, the last known tuned frequency at the first power level may be stored by a controller associated with RF power source 318, such as for example, in memory 342 of controller 340 and provided to the RF power source.

In some embodiments, at the transition from one power level state to the other, there should be a hold time, for example T_hold 256 in FIG. 2, during which the frequency is fixed at the last known good value to allow for: (1) changing the frequency to the new value and (2) leaving time for the plasma to adapt to the new condition. This fixed timeout dictates the highest pulsing frequency/pulsing duty cycle that can be used as the minimum ON-time (for duty cycles <50%) or OFF time (for duty cycles >50%) of the pulse needs to be greater than the timeout. That is, T_hold 256 determines the minimum ON-time for each state (T_hold<ON-time). The value of T_hold is dependent on the RF generator and chamber design.

The inventive methods may be utilized in conjunction with any type of process chamber utilizing bias power having single or multiple frequencies. Exemplary process chambers include any process chamber used for etching processes, for example, such as the ADVANTEDGE™, or other process chambers, available from Applied Materials, Inc. of Santa Clara, Calif. Other process chambers, including those from other manufacturers, may similarly be used.

Figure 3:
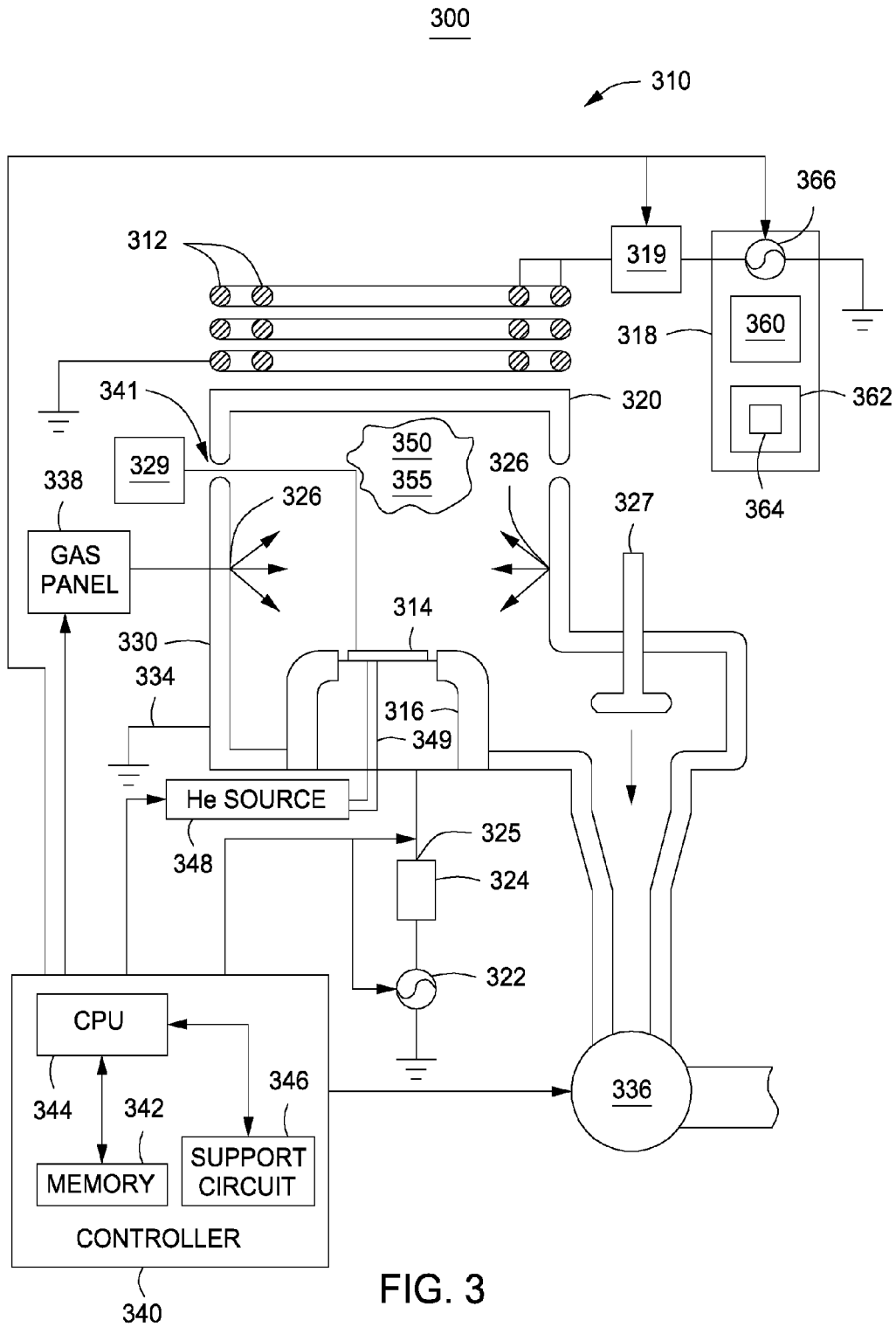
FIG. 3 depicts a process chamber suitable to perform a method for frequency tuning in process chambers using dual level pulsed power in accordance with some embodiments of the present disclosure.

For example, FIG. 3 depicts a schematic diagram of an illustrative system 300 of the kind that may be used to practice embodiments of the disclosure as discussed herein. The process chamber 310 of system 300 may be utilized alone or as a processing module of an integrated semiconductor substrate processing system, or cluster tool, such as a CENTURA integrated semiconductor substrate processing system, available from Applied Materials, Inc. of Santa Clara, Calif. Examples of suitable etch reactors include the ADVANTEDGE™ line of etch reactors (such as the AdvantEdge G3 or the AdvantEdge G5), the DPS® line of etch reactors (such as the DPS®, DPS® II, DPS® AE, DPS® HT, DPS® G3 poly etcher), or other etch reactors, also available from Applied Materials, Inc. Other process chambers and/or cluster tools may suitably be used as well.

The system 300 generally comprises a process chamber 310 having a substrate support (cathode) 316 within a conductive body (wall) 330, and a controller 340. The chamber 310 may be supplied with a substantially flat dielectric ceiling 320. Alternatively, the chamber 310 may have other types of ceilings, e.g., a dome-shaped ceiling. An antenna comprising at least one inductive coil element 312 is disposed above the ceiling 320 (two co-axial inductive coil elements 312 are shown).

The inductive coil element 312 is coupled to a RF plasma power source 318 through a first matching network 319. The matching network 319 is held during frequency tuning. In some embodiments, the matching network 319 may be needed due to the different fixed positions that are needed for different processes. In some embodiments, the RF power source 318 may be capable of producing up to 3000 W at a tunable frequency in a range from about +/−5% to about +/−10% of the frequency generator output. For example, a 13.56 MHz RF power source may produce a tunable frequency in a range from about +/−5% to about +/−10% of 13.56 MHz. The RF power source 318 may include an RF generator 366, a frequency tuner 360, and a controller 362 that includes a memory 364 for storing the last known tuned frequencies of a high power level state and a low power level state. In some embodiments, the RF power source 318 may be controlled by controller 340. In some embodiments, the pulse frequency should be less than the RF frequency, and both the p_high ON-time and p_low ON-time should be greater than the RF period.

The substrate support 316 may include an electrostatic chuck for retaining the substrate 314 and is coupled, through a second matching network 324 having a matching network output (cathode input) 325, to a biasing power source 322. In some embodiments, the biasing power source 322 may be capable of producing up to 1500 W at a frequency of approximately 13.56 MHz. The biasing power may be either continuous or pulsed power. In some embodiments, the biasing power source 322 may be a DC or pulsed DC source. In some embodiments, a probe 327 may be disposed within the chamber 310 proximate the substrate support 316 to provide measurements (e.g., the first DC voltage measurement of the substrate described above) within the process chamber 310. The probe 327 may be fed out of the chamber 310 via a port 341 disposed in the wall 330 of the chamber 310. In some embodiments, a controller 329 may be coupled to the probe 327 to facilitate recording or displaying the measurements of the probe 327.

The controller 340 generally comprises a central processing unit (CPU) 344, a memory 342, and support circuits 346 for the CPU 344 and facilitates control of the components of the chamber 310 and, as such, of the tuning process, as discussed above.

To facilitate control of the process chamber 310 as described above, the controller 340 may be one of any form of general-purpose computer processor that can be used in an industrial setting for controlling various chambers and sub-processors. The memory 342, or computer-readable medium, of the CPU 344 may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and subsystems, and the like. The inventive methods described herein are generally stored in the memory 342 as a software routine. The software routine may also be stored and/or executed by a second CPU (not shown) that is remotely located from the hardware being controlled by the CPU 344.

In an exemplary operation of the system 300, a substrate 314 is placed on the substrate support 316 and process gases are supplied from a gas panel 338 through entry ports 326 and form a gaseous mixture 350. The gaseous mixture 350 is ignited into a plasma 355 in the chamber 310 by applying power from the plasma power source 318 and biasing power source 322 to the inductive coil element 312 and the cathode 316, respectively. The pressure within the interior of the chamber 310 is controlled using a throttle valve 331 and a vacuum pump 336. Typically, the wall 330 is coupled to an electrical ground 334. The temperature of the wall 330 may be controlled using liquid-containing conduits (not shown) that run through the wall 330.

In some embodiments, the temperature of the substrate 314 may be controlled by stabilizing a temperature of the substrate support 316. In some embodiments, a gas from a gas source 348 is provided via a gas conduit 349 to channels (not shown) formed in the pedestal surface under the substrate 314. The gas is used to facilitate heat transfer between the substrate support 316 and the substrate 314. During processing, the substrate support 316 may be heated by a resistive heater (not shown) within the substrate support 316 to a steady state temperature and then the helium gas facilitates uniform heating of the substrate 314.

While the foregoing is directed to embodiments of the present disclosure, other and further embodiments of the disclosure may be devised without departing from the basic scope thereof.

The invention claimed is:

1. A method for frequency tuning in process chambers using N-level pulsed power, the method comprising:
   providing, by an RF power source, N levels of pulsed power at N different time periods that make up a duty cycle, wherein each of the N levels of pulsed power is provided at a corresponding frequency, and wherein each corresponding frequency is a last known tuned frequency at the level of pulsed power provided;
   at each of the N different time periods, adjusting the initial frequency of the pulsed power provided to a second frequency to achieve a desired impedance between the RF power source and a load; and
   storing the second frequency as the last known tuned frequency at the level of pulsed power provided.

2. The method of claim 1, wherein each of the last known tuned frequencies at each of the N levels of pulsed power are stored in a memory of a controller disposed in the RF power source.

3. The method of claim 1, wherein each of the last known tuned frequencies at each of the N levels of pulsed power are stored on a controller that controls the RF power source.

4. A method for frequency tuning in process chambers using N-level pulsed power, the method comprising:
   providing a first pulsed power at a first frequency by an RF power source for a first period of time while the first frequency is adjusted to a second frequency to achieve a desired impedance at the first pulsed power between the RF power source and a load, wherein the first frequency is a last known tuned frequency at the first pulsed power;
   storing the second frequency as the last known tuned frequency at the first pulsed power;
   providing an Nth pulsed power at a third frequency by the RF power source for a second period of time while the third frequency is adjusted to a fourth frequency to achieve a desired impedance at the Nth pulsed power between the RF power source and the load, wherein the first pulsed power and the Nth pulsed power are different and non-zero, and wherein the third frequency is a last known tuned frequency at the Nth pulsed power; and storing the fourth frequency as the last known tuned frequency at the Nth pulsed power.

5. The method of claim 4, further comprising:

providing the Nth pulsed power at the fourth frequency, which was stored as the last known tuned frequency at the Nth pulsed power, for a third period of time while the fourth frequency is adjusted to a fifth frequency to achieve the desired impedance at the Nth pulsed power between the RF power source and the load; and storing the fifth frequency as the last known tuned frequency at the Nth pulsed power.

6. The method of claim 4, wherein the last known tuned frequency at the first pulsed power and the last known tuned frequency at the Nth pulsed power are stored in a memory of a controller disposed in the RF power source.

7. The method of claim 4, wherein the last known tuned frequency at the first pulsed power and the last known tuned frequency at the Nth pulsed power are stored on a controller that controls the RF power source.

8. The method of claim 4, wherein the frequency of the Nth pulsed power is not adjusted until a predetermined hold time has expired.

9. The method of claim 8, wherein the hold time is set to allow Nth pulsed power to reach the third frequency and to allow a plasma to adapt to the Nth pulsed power and third frequency.

10. The method of claim 4, wherein adjusting the third frequency to the fourth frequency reduces a reflected power from the RF power source during the second time period.

11. The method of claim 10, wherein the reflected power is reduced to a target of about 0% of a forward power provided by the RF power source.

12. A method for processing a substrate using an N-level pulsed radio frequency (RF) plasma, comprising:

providing RF energy to a plasma in a process chamber at N pulsed power levels, wherein the RF energy provided at each of the N pulsed power levels is provided at a different time period;

determining a turned frequency for each of the N pulsed power levels to reduce a reflected power of the RF energy provided at each of the N pulsed power levels;

storing each tuned frequency for each of the N pulsed power levels as a last known tuned value for the corresponding pulsed power level; and when switching between power levels, setting an initial frequency of the RF energy to the last known tuned value for the corresponding pulsed power level provided.

13. The method of claim 12, wherein the RF energy provided is from a single RF power source.

14. The method of claim 13, wherein each of the last known tuned frequencies at each of the N levels of pulsed power are stored in a memory of a controller disposed in the RF power source.

15. The method of claim 13, wherein each of the last known tuned frequencies at each of the N levels of pulsed power are stored on a controller that controls the RF power source.

16. The method of claim 12, wherein the frequency at each pulsed power level is not tuned until a first predetermined hold time has expired.

17. The method of claim 16, wherein the hold time is set to allow the RF energy provided at each pulsed power level to reach a first frequency and to allow a plasma to adapt to the RF energy provided at each pulsed power level and first frequency.

* * * * *